US005661435A

United States Patent [19]
Coleman

[11] Patent Number: 5,661,435
[45] Date of Patent: Aug. 26, 1997

[54] LOW NOISE WIDE BAND AMPLIFIER

[75] Inventor: Edward P. Coleman, Monroe County, N.Y.

[73] Assignee: PSC, Inc., Webster, N.Y.

[21] Appl. No.: 478,695

[22] Filed: Jun. 7, 1995

Related U.S. Application Data

[63] Continuation of Ser. No. 193,834, Feb. 9, 1994, Pat. No. 5,504,456.

[51] Int. Cl.$^6$ ........................................... H03F 1/34
[52] U.S. Cl. ............................................ 330/107; 330/109
[58] Field of Search .................................. 330/107, 109, 330/110, 150

[56] References Cited

U.S. PATENT DOCUMENTS

| | | | |
|---|---|---|---|
| 3,628,129 | 12/1971 | Riley | 323/100 |
| 4,091,333 | 5/1978 | Thrap | 330/110 |
| 4,152,659 | 5/1979 | Gordon | 330/9 |
| 4,218,613 | 8/1980 | Blerz | 250/214 A |
| 4,275,357 | 6/1981 | Nakayama et al. | 330/107 |
| 4,415,803 | 11/1983 | Muoi | 250/214 A |
| 4,429,281 | 1/1984 | Ito et al. | 330/107 X |
| 4,535,233 | 8/1985 | Abraham | 250/214 A |
| 4,543,546 | 9/1985 | Hariharan | 330/109 X |
| 4,558,292 | 12/1985 | Sasaki et al. | 330/109 X |
| 4,559,502 | 12/1985 | Huijsing | 330/310 X |
| 4,595,884 | 6/1986 | Miller, Jr. | 330/258 |
| 4,623,786 | 11/1986 | Rodwell | 250/214 A |
| 4,626,678 | 12/1986 | Morita et al. | 250/214 A |
| 4,628,303 | 12/1986 | Boyle | 340/661 |
| 4,761,549 | 8/1988 | Mealer et al. | 330/308 X |
| 4,827,119 | 5/1989 | Gaboury | 250/214 R |
| 4,868,401 | 9/1989 | Erickson et al. | 250/548 |
| 4,879,521 | 11/1989 | Bredemann et al. | 330/258 |
| 4,889,985 | 12/1989 | Allsop et al. | 250/214 A |
| 5,012,202 | 4/1991 | Taylor | 330/284 |
| 5,023,951 | 6/1991 | Kahn | 455/619 |
| 5,027,081 | 6/1991 | Baum | 330/84 |
| 5,075,633 | 12/1991 | Bowers | 330/69 |
| 5,117,103 | 5/1992 | Flamm | 250/229 |
| 5,123,732 | 6/1992 | Gross et al. | 356/73.1 |
| 5,155,447 | 10/1992 | Huijsing et al. | 330/107 |
| 5,317,277 | 5/1994 | Cavigelli | 330/109 |
| 5,486,790 | 1/1996 | Huijsing et al. | 330/107 X |
| 5,504,456 | 4/1996 | Coleman | 330/107 |

OTHER PUBLICATIONS

McGraw-Hill Encyclopedia of Electronics and Computers, 1984, pp. 28–30, pp. 340–341.

*Primary Examiner*—Steven Mottola
*Attorney, Agent, or Firm*—Joseph F. Murphy

[57] ABSTRACT

An amplifier circuit provides wide bandwidth low noise performance by minimizing the effect of a pole created by the feedback resistor and the capacitance of the input device, such as a photodiode. This is accomplished by shifting the dominant pole to higher frequencies in the amplifier disclosed. A first amplifier stage receives a signal from an input device, such as the photodiode, and feedback from a second amplifier stage. The first amplifier stage is connected to the second amplifier stage such that a lower gain stage is employed to eliminate the phase shift which occurs if the amplifier alone is used in open loop form. The output of the low gain stage is provided to a second amplifier stage with associated gain setting components such that the dominant pole of the overall amplifier is shifted to a higher frequency, typically two decades higher than available from the single stage open loop amplifier. The noise performance of the amplifier is such that it is often unnecessary to apply a capacitor across a feedback resistor from the output of the amplifier to the signal source input, thus improving overall frequency performance.

7 Claims, 14 Drawing Sheets rgl(101000) = 1.002    phg1(101000) = 77.6

LOW NOISE WIDE BAND AMPLIFIER

This application is a continuation of application Ser. No. 08/193,834, filed Feb. 9, 1994, now U.S. Pat. No. 5,504,456.

BACKGROUND OF THE INVENTION

1. Field of the Invention

The invention concerns amplifiers in general and in particular a wideband low noise amplifier for use in low signal strength applications.

2. Related Art

Low noise wide bandwidth amplifiers have numerous applications. One such application is the detection of low level signals from a photodiode activated by an external light source, for example, in a bar code scanner. A conventional low noise wideband photodiode amplifier, as shown in FIG. 1, employs a single port feedback system using off the shelf amplifier technology, for example, a commercially available operational amplifier known as TLC 272. In the example shown in FIG. 1, the amplifier 101 is biased on its non-inverting terminal and its inverting terminal receives a signal from the photodiode and feedback through a resistor $R_1$ and capacitor C1 from the output terminal.

The desirable results of increasing bandwidth and reducing sensitivity to noise are typically at odds in such designs. For example, random fluctuations produced by thermal agitation of electrons, or Johnson noise, is proportional to the square root of the feedback resistance $R_1$. Since in such an amplifier the output signal is proportional to the feedback resistance, $R_1$, the signal to noise ratio is proportional to $R_1/\sqrt{R_1}$. This signal to noise ratio increases with increasing values of $R_1$. Unfortunately, as $R_1$ is increased to improve the signal to noise ratio, the open loop pole of the amplifier formed by feedback resistor $R_1$ and diode capacitance Cd, combined with the dominant pole of the TLC 272 amplifier work to quickly reduce the phase margin of the circuit, resulting in an unstable amplifier. One solution to this problem is to increase the value of the capacitor $C_1$ across resistor $R_1$. Unfortunately, this limits the bandwidth of the amplifier because of a closed loop pole formed by the product of $C_1$ and $R_1$. FIGS. 2, 3a and 3b illustrate the maximum bandwidth which can be achieved when $R_1$ is set to 1 megohm, $C_1$ is set to 22 picofarads, the diode capacitance $C_d$ equals 75 picofarads and the diode resistance $R_d$ equals 50 megohms. Thus, the performance limitations of conventional amplifiers restrict their utility to either wide bandwidth applications with a high noise tolerance, or low noise applications with a narrow bandwidth.

U.S. Pat. No. 4,535,233 to Abraham discloses a bootstrap transimpedance preamplifier for a fiber optic receiver. FIG. 2c of Abraham illustrates a three OP-AMP circuit with a resistor providing feedback from the output of the third OP-AMP to the non-inverting input of the first OP-AMP. Column 4, lines 47–55 of Abraham discuss limitations that do not exist in an amplifier according to the invention, as disclosed herein. Abraham discloses that because the feedback resistor is larger than the input resistor in other configurations disclosed therein, noise is reduced and sensitivity is increased. Abraham also discloses that the feedback resistor increases the bandwidth limiting effect of the capacitance of the detector. Abraham seeks to address this problem with a bootstrap circuit. Thus, Abraham fails to recognize that by shifting the dominant pole of the overall amplifier to a higher frequency, in the open loop response, the bandwidth limiting effects can be reduced. In Abraham, the first amplifier acts as a current buffer and, because of the absence of negative feedback, there is no attempt to extend the dominant pole to a higher frequency. As discussed further herein, an amplifier according to the invention extends the dominant pole to a higher frequency, thereby eliminating the need for capacitive compensation across the feedback resistor, which may be required in Abraham to maintain stability in view of the disclosure in column 4, lines 47–55 of Abraham.

SUMMARY AND OBJECTS OF THE INVENTION

In view of the limitations of the related art, it is an object of the invention to provide an amplifier with low noise performance characteristics over a wideband of frequencies. This and other objects of the invention are achieved by an amplifier configuration in which a lower gain stage is employed to provide a high impedance input to the amplifier. The output of this low gain stage is provided to a second amplifier stage with associated components setting a gain such that the dominant pole of the overall amplifier is shifted to a higher frequency, typically at least two decades higher than available from the single stage open loop amplifier. For many applications this configuration eliminates the need for a capacitor across the feedback resistor between the output of the amplifier as a whole and its inverting input.

The invention is particularly applicable to converting a low level current signal from a photodiode into a voltage which is proportional to the photodiode current and hence, the optical Rower incident on the photodiode detector. The signal can then be amplified and used to determine the optical power incident on the detector. Although the invention can be used whenever low noise and wide bandwidth performance is required, one particularly useful application is found in bar code scanning. In bar code scanning, sub-microamp signals in the 500 hz to 40 Khz frequency range must often be detected from the photodiode. False triggers can result however if the response of the amplifier has excessive overshoot. Thus, the invention provides accurate detection of signals from photodetector diodes and other low level signal sources. This amplifier is also useful whenever amplifying a signal generated from a high source impedance, where small parasitic capacitance would have a more pronounced adverse effect on frequency response. One example of this parasitic source is capacitance introduced by the length of the run line.

An amplifier according to the invention has first and second amplifier stages. The output of the first amplifier stage is applied to an inverting input of both the first and second amplifier stages. An output of the second amplifier stage is applied to a non-inverting input of the first amplifier stage and an inverting input of the second amplifier stage. The application of these signals is through appropriate impedances which set the gain and tailor the frequency response according to desired characteristics. For example, the inverting input of the second amplifier section is connected to the output of the first amplifier stage, herein referred to as the intermediate output, through a first impedance. It is also connected to the output of the second amplifier stage, herein referred to as the amplifier output, through a second impedance. The non-inverting input of the second amplifier stage is connected to a bias source. The non-inverting input of the first amplifier stage is connected directly to a signal source, such as a photodiode, and to the amplifier output through a third impedance. Finally, the inverting input of the first amplifier stage is connected through a fourth impedance to the intermediate output and through a fifth impedance to ground.

Thus, an amplifier circuit according to the invention can be formed from a cascade of at least two closed loop amplifier circuits, each said amplifier circuit having a dominant pole in a first frequency range, with negative feedback from a last stage of said cascade to a first stage of said cascade thereby forming a dominant pole of said cascade at a second frequency in a range higher than said first frequency range.

BRIEF DESCRIPTION OF THE DRAWINGS

The foregoing and other objects, features and advantages of the invention, as well as a presently preferred embodiment thereof will become more apparent from a reading of the following description in connection with the accompanying drawings in which:

FIG. 5 depicts an equivalent circuit to the circuit shown in FIG. 4a;

FIGS. 8b through 8d depict the closed loop and open loop response of the example amplifier in FIG. 8a;

FIGS. 9c through 9f show the closed loop and open loop response of the example amplifier in FIG. 9a;

DETAILED DESCRIPTION OF THE PREFERRED EMBODIMENTS

Figure 4A:
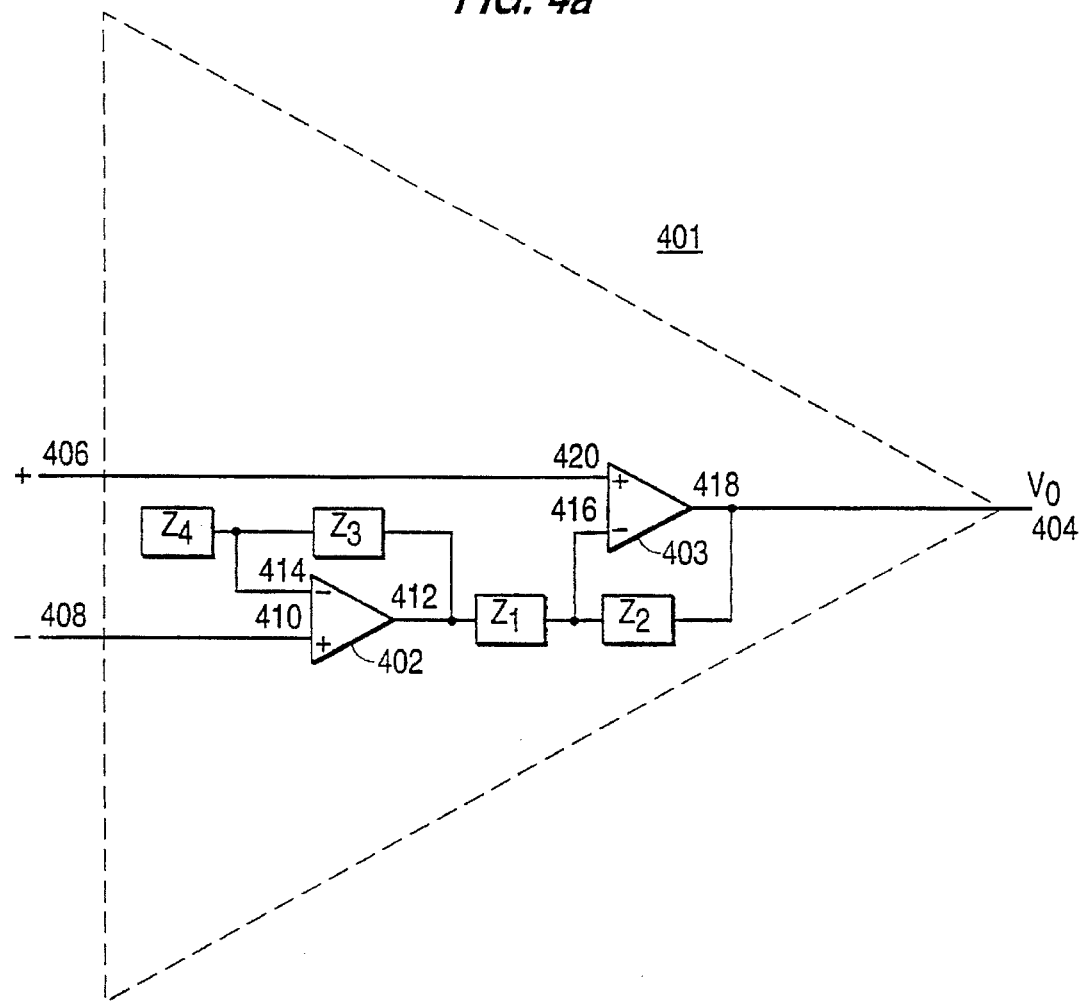
FIGS. 4a and 4b show an open loop configuration of the amplifier according to the invention.

FIG. 4a shows an open loop configuration of an amplifier 401 according to the invention. The amplifier 401 has an output on signal line 404, a non-inverting input 406, and an inverting input 408. The amplifier 401 contains two conventional operational amplifiers (OP-AMPs) 402 and 403, such as the TLC 272 OP-AMP which, with their associated components, form first and second amplifier stages. The non-inverting input 410 of the first OP-AMP 402 acts as the inverting input of the amplifier 401 and is connected directly thereto. The output 412 of the first OP-AMP 402 is fed back, through impedance Z3, to the inverting input 414 of the first OP-AMP 402. The inverting input 414 of the first OP-AMP 402 is connected to ground through impedance Z4. As shown later in FIG. 8a, in some configurations certain of the impedances can be zero (short circuit) and infinite (open).

The output 412 of the first OP-AMP 402 is connected to the inverting input 416 of the second OP-AMP 403 through impedance Z1. The output 418 of the second OP-AMP 403 is fed back, through impedance Z2, to the inverting input 416 of the second OP-AMP 403. The output 418 of the second OP-AMP 403 also serves as the output 404 of the amplifier 401, and is connected directly thereto. The non-inverting input 420, of the second OP-AMP 403 serves as the non-inverting input of the amplifier 406 and is therefore connected to a bias.

Figure 4B:
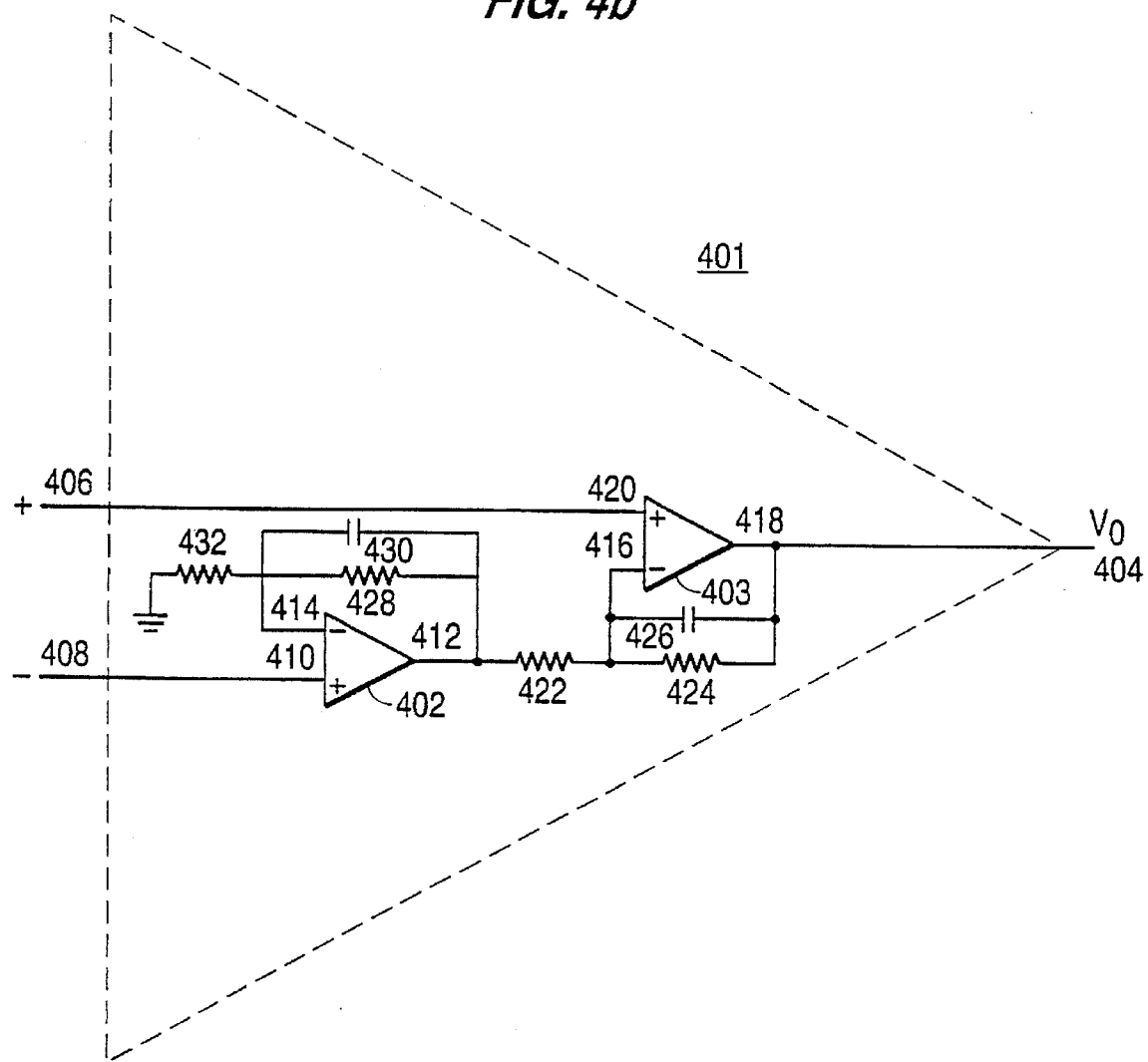

FIG. 4b shows an example of the open loop amplifier of FIG. 4a, with specific components that form the impedances Z1–Z4. All of the other features of FIG. 4a remain consistent in FIG. 4b. Z1 is a resistor 422. Z2 is formed with resistor 424 in parallel with capacitor 426. Z3 is formed with resistor 428 in parallel with capacitor 430. Z4 is resistor 432.

Figure 5:
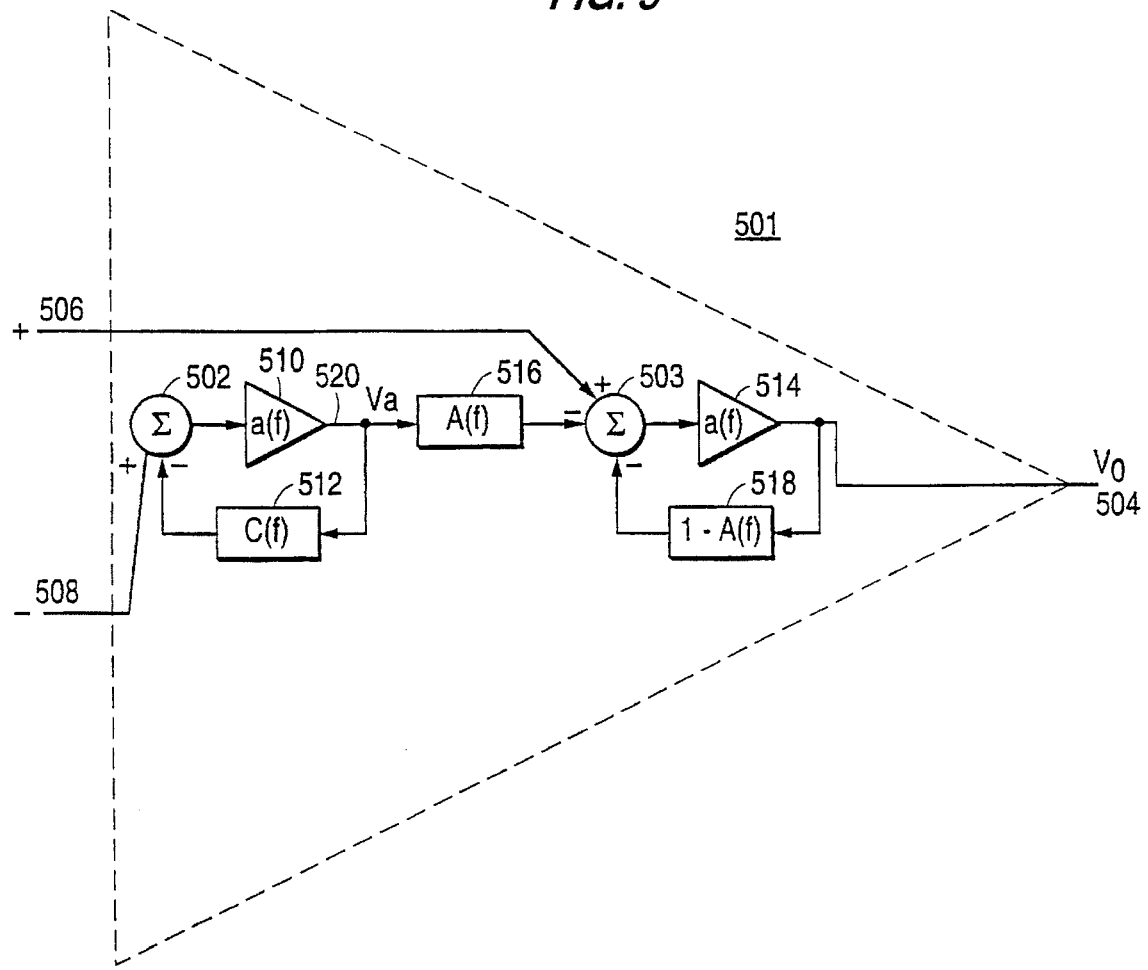

FIG. 5 depicts an equivalent circuit to the circuit of FIG. 4a. In FIG. 5, amplifier 501, output 504, non-inverting input 506, and inverting input 508 are analogous to their counterparts 401, 404, 406 and 408 of FIG. 4a.

The equivalent to OP-AMP 402 and impedances Z3 and Z4 is depicted as summing junction 502, gain stage a(f) 510 and feedback C(f) 512. The equivalent to OP-AMP 403 and impedance Z1 and Z2 is depicted as summing junction 503, gain stage a(f) 514, input A(f) 516 and feedback (1−A(f)) 518. The closed loop gain of the first OP-AMP 402 can be calculated as a function of Va 520 and Vi 508 such that:

$$\frac{Va}{Vi} = \frac{1}{\frac{1}{a(f)} + C(f)}$$

The closed loop gain of the second OP-AMP can be calculated as a function of Vo 504 and Va 520 such that:

$$\frac{Vo}{Va} = \frac{-A(f)}{1 - A(f) + \frac{1}{a(f)}}$$

As a result, the open loop gain of the amplifier, can be calculated from the cascade of the two closed loop gains as a function of Vo 504 and Vi 508 such that:

$$\frac{Vo}{Va} = \frac{1}{\frac{1}{a(f)} + C(f)} \cdot \frac{A(f)}{1 - A(f) + \frac{1}{a(f)}}$$

For the example depicted in FIG. 4b and assuming resistor 422 is 2KΩ, resistor 424 is 47KΩ, capacitor 426 is 10 pf, resistor 428 is 47KΩ, capacitor 430 is 10 pf and resistor 432 is 47KΩ, A(f) and C(f) can be calculated as follows:

Since $$Z3(f) = \frac{1}{\frac{1}{47,000} + \frac{1}{10\,pf(f)}}$$

$$Z2(f) = \frac{1}{\frac{1}{47,000} + \frac{1}{10\,pf(f)}}$$

Then $$A(f) = \frac{Z2(f)}{Z2(f) + 2000} = \frac{\frac{1}{\frac{1}{47,000} + \frac{1}{10\,pf(f)}}}{\frac{1}{\frac{1}{47,000} + \frac{1}{10\,pf(f)}} + 2000}$$

and

-continued $$C(f) = \frac{47,000}{47,000 + Z3(f)} = \frac{47,000}{47,000 + \cfrac{1}{\cfrac{1}{47,000} + \cfrac{1}{10\,pf(f)}}}$$

Figure 1:
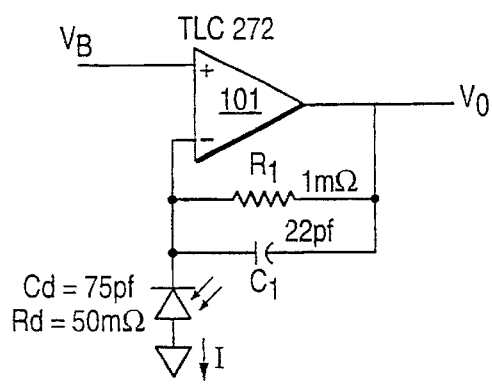
FIG. 1 shows a photodiode amplifier as known conventionally in the prior art.
Figure 6A:
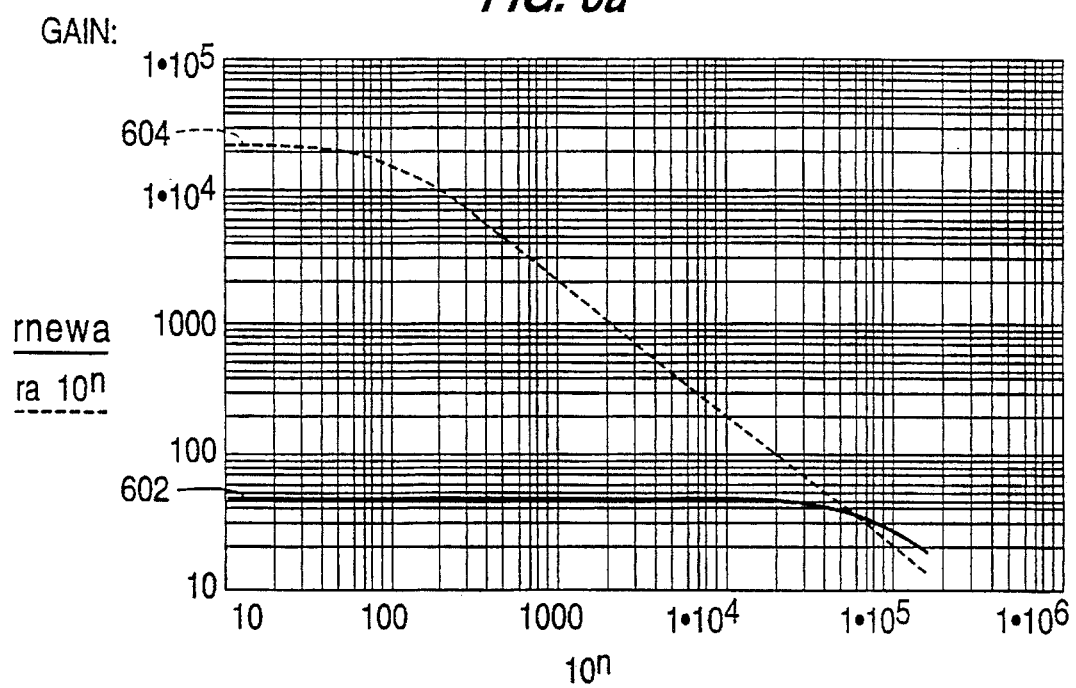
FIGS. 6a and 6b depict the open loop gain and phase characteristics of the amplifier of FIG. 4b compared to the response of the amplifier of FIG. 1.
Figure 6B:
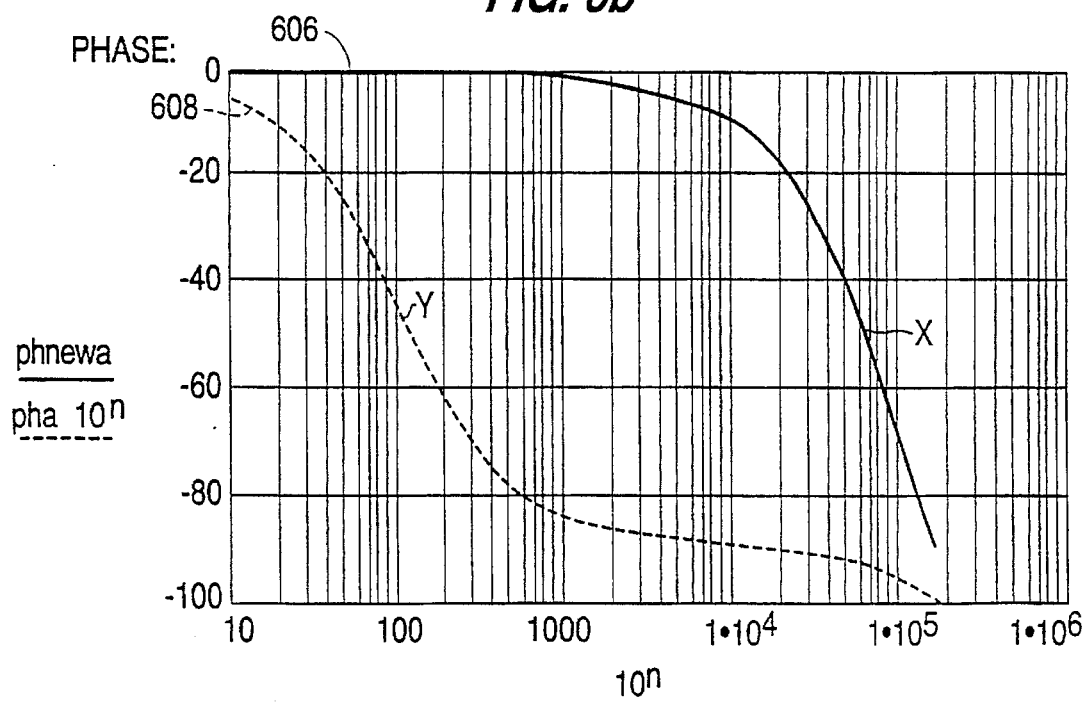

FIGS. 6a and 6b depict the resulting open loop gain and phase characteristics of the amplifier compared to those of the amplifier in FIG. 1. In FIG. 6a, solid line 602 depicts the gain characteristics of the example amplifier according to the invention. The dashed line 604 depicts the gain characteristics of prior art amplifiers, such as the TLC 272. As can be seen in FIG. 6a, the open loop gain shown in line 602 of the example amplifier according to the invention is constant (at approximately 47) well beyond 10 Khz. In contrast, the open loop gain in the prior art shown in line 604 begins to roll off before 100 Hz.

FIG. 6b shows that the amplifier in the example according to the invention has less than 45 degree phase shift out beyond 50 Khz. This phase shift value allows the presence of an additional 90 degrees of phase shift due to $R_1$ and the capacitance of the photodiode without causing instability. Stability is determined based on the conventional standard in the art that a system is stable as long as the phase margin exceeds 45°.

Figure 7:
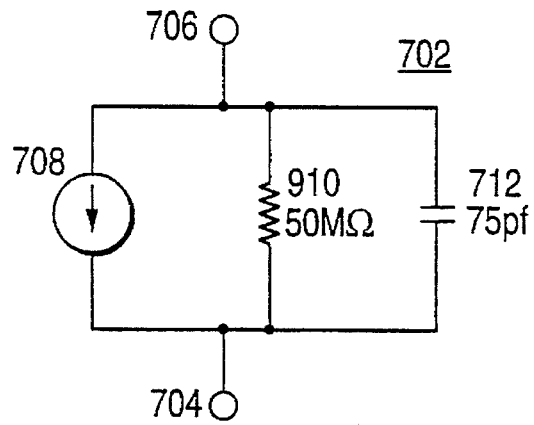
FIG. 7 illustrates a model of a photodiode which can supply the current to the amplifier of the invention.

As discussed earlier, one field for which the new amplifier circuit is useful is for detecting low level signals from photodiodes, such as those used in bar-code scanners. FIG. 7 illustrates a model 702 for a photodiode in such a device. The model has two nodes, 704 and 706 and three elements connected in parallel between these nodes. These elements are a current source 708, a resistor 710 and a capacitor 712. Typical values for the resistor 710 and capacitor 712 are on the order of 50 Mohms and 75–90 picofarads, respectively. The current supplied by the current source is a function of the light incident on the detector.

Figure 2:
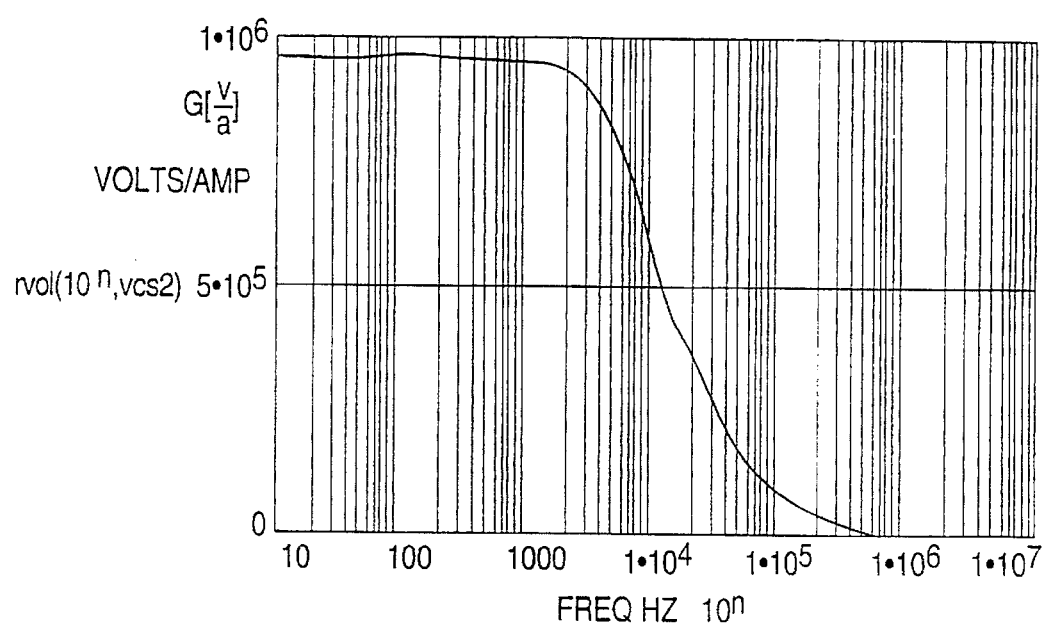
FIG. 2 illustrates the closed loop response of the amplifier of FIG. 1.
Figure 3A:
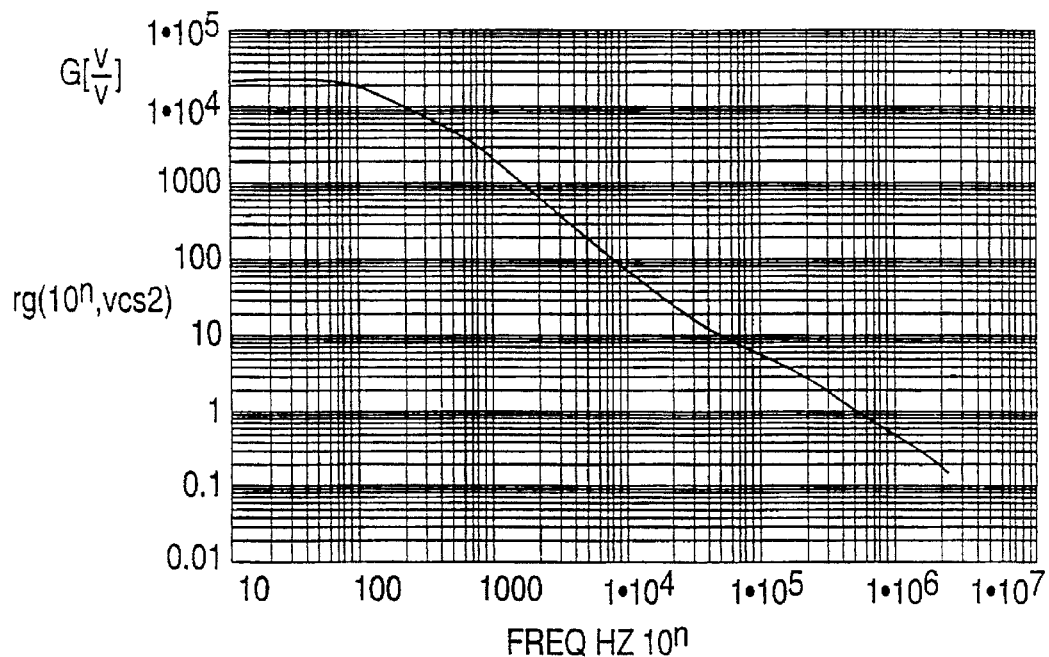
FIGS. 3a and 3b illustrate the open loop response of the amplifier of FIG. 1 when set with representative resistive and capacitive values.
Figure 3B:
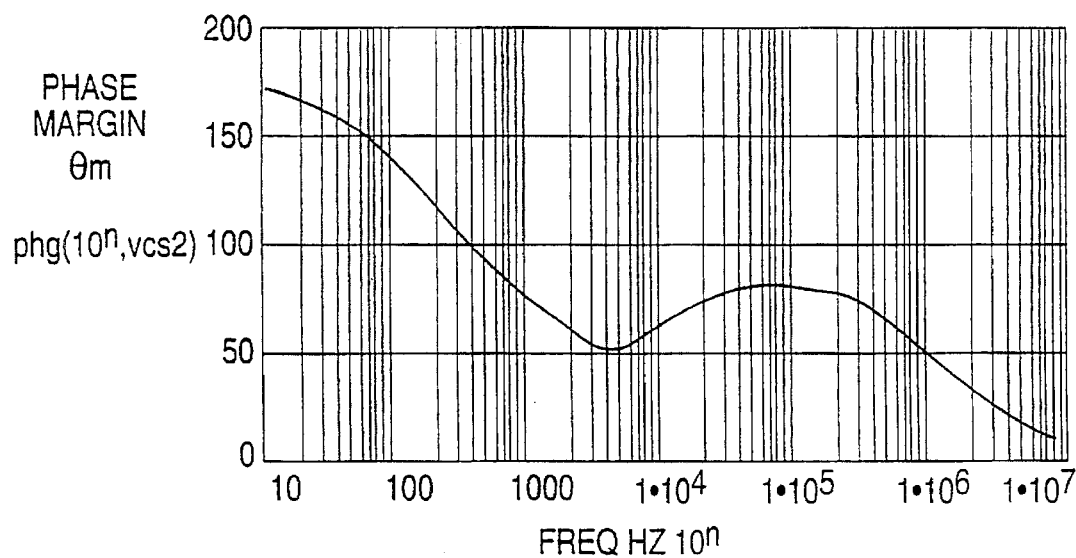
Figure 8A:
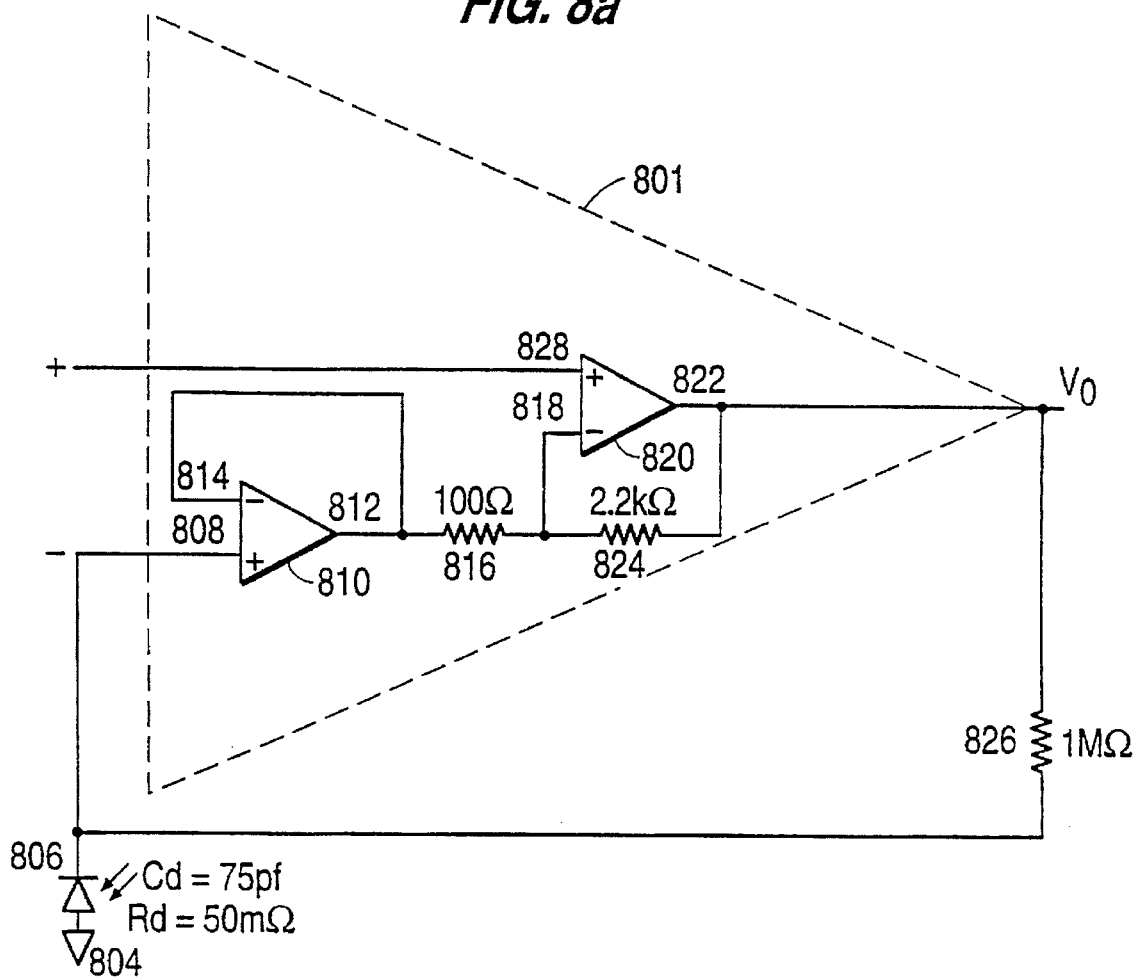
FIG. 8a depicts an example of a closed loop configuration of an amplifier according to the invention.
Figure 8B:
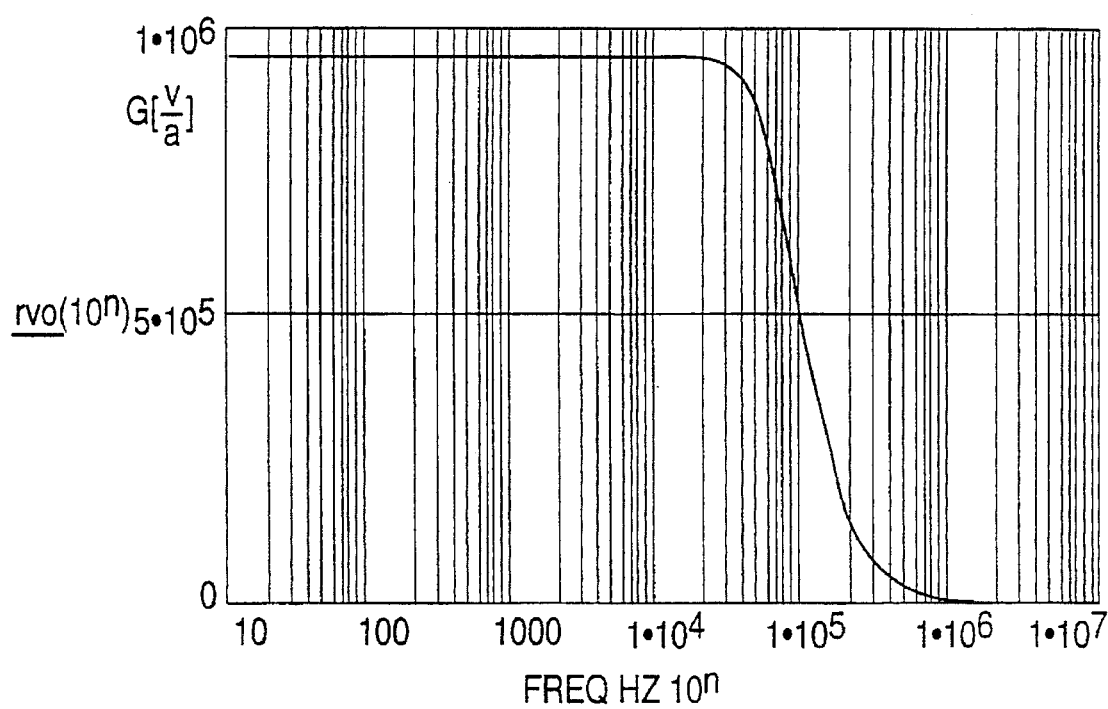
Figure 8C:
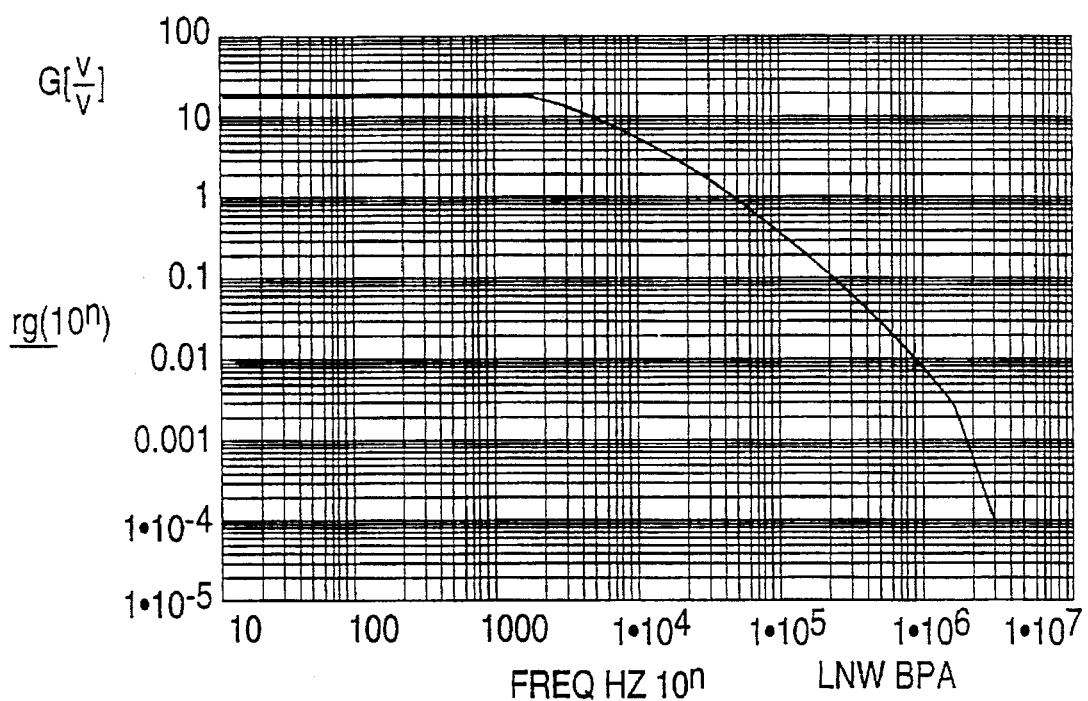
Figure 8D:
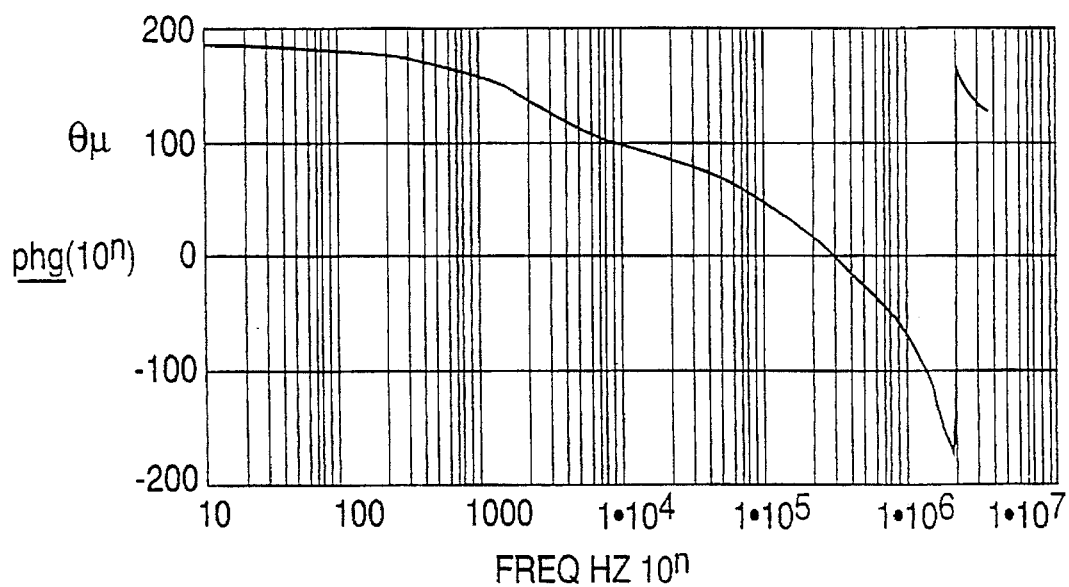

FIG. 8a depicts one example of a closed loop configuration of an amplifier 801 according to the invention utilizing a photodiode as an input current source. The photodiode, as depicted in model 702 of FIG. 7 has node 704 connected to ground (depicted as 804 in FIG. 8) and node 706 (806, FIG. 8) connected to the non-inverting input of the first OP-AMP 810. The output 812 of the first OP-AMP 810 is fed back to the inverting input 814 of the first OP-AMP 810, thus forming the first amplifier stage of amplifier 801. The output 812 of the first amplifier stage is also connected, through resistor 816, to the inverting input 818 of the second OP-AMP 820. The output 822 of the second OP-AMP 820 is fed back to the inverting input 818 of the second OP-AMP 820 through resistor 824 thus forming a second amplifier stage. The output 822 of the second OP-AMP 820 is also fed back to the inverting input of amplifier 801, which is the non-inverting input 808 of the first OP-AMP 810, through resistor 826. The non-inverting input 828 is biased with, for example, 2 volts. Typical values for resistors 816, 824 and 826 are 100 ohms, 2.2 Kohms, and 1 Mohm respectively. Using these values yields the closed loop response curve depicted in FIG. 8b, and the open loop response curves depicted in FIGS. 8c and 8d. Comparing FIG. 8b to FIG. 2, one should note that the frequency response improves from 12 Khz in the prior art to 100 Khz in the instant invention.

Figure 9A:
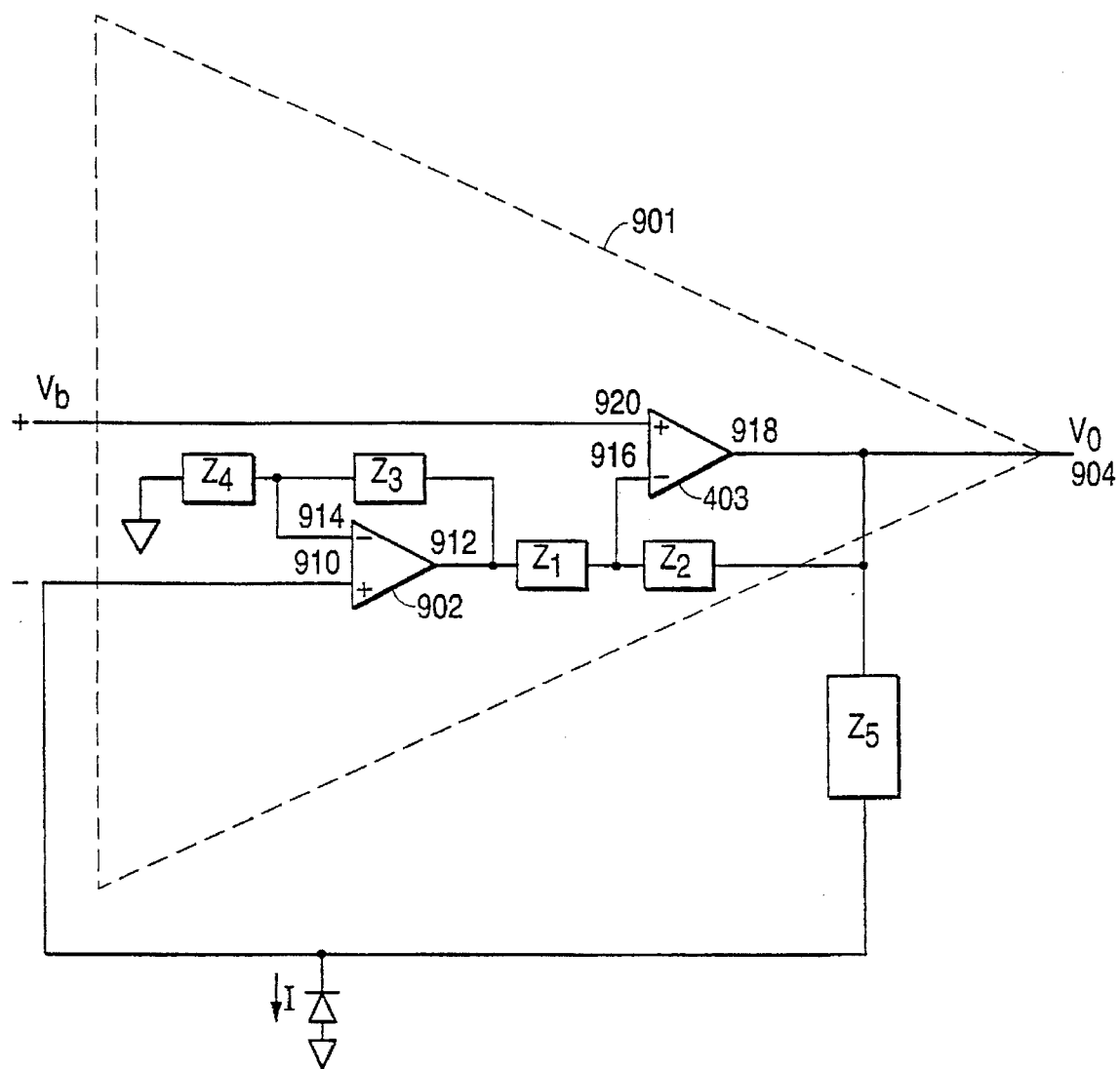
FIG. 9a illustrates the amplifier of FIG. 4a in a closed loop configuration.

FIG. 9a illustrates the amplifier according to the invention as shown in FIG. 4a in a closed loop configuration. An impedance Z5 is connected between the output 904 and the non-inverting input 910 of first OP-AMP 902, which is the inverting input of the amplifier 901 as a whole. Also, a photo-diode based current source as described in FIG. 7 is connected to the non-inverting input 910 of first OP-AMP 902, which is the inverting input of the amplifier 901 as a whole. The other elements of FIG. 9a are identical to their counter parts in FIG. 4a (e.g., 912=412, 914=414, 916=416, etc.). By selecting the components used to form the impedances, the amplifier according to the invention can be tailored to a desired frequency response.

Figure 9B:
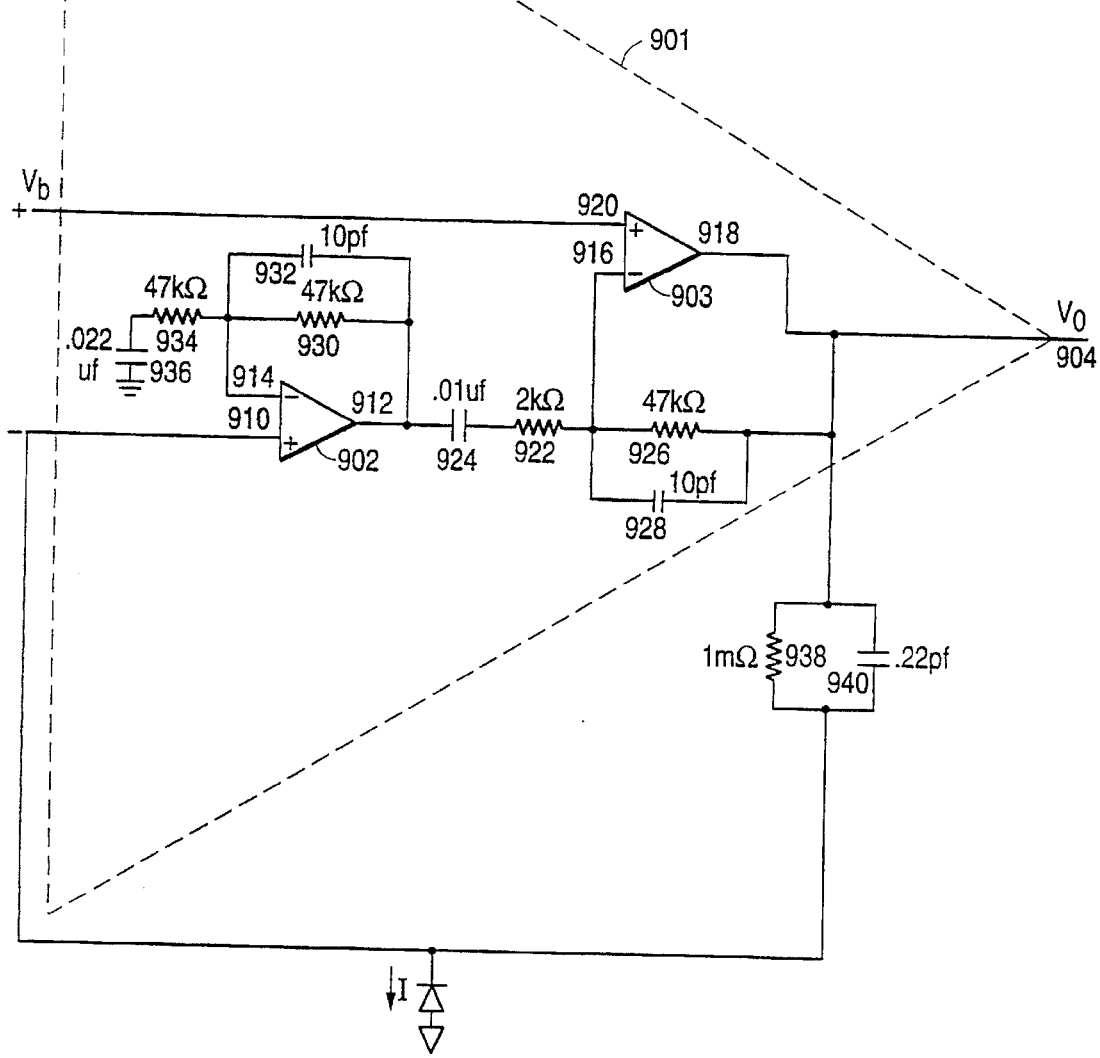
FIG. 9b depicts an amplifier according to the invention with a bandpass characteristic.
Figure 9C:
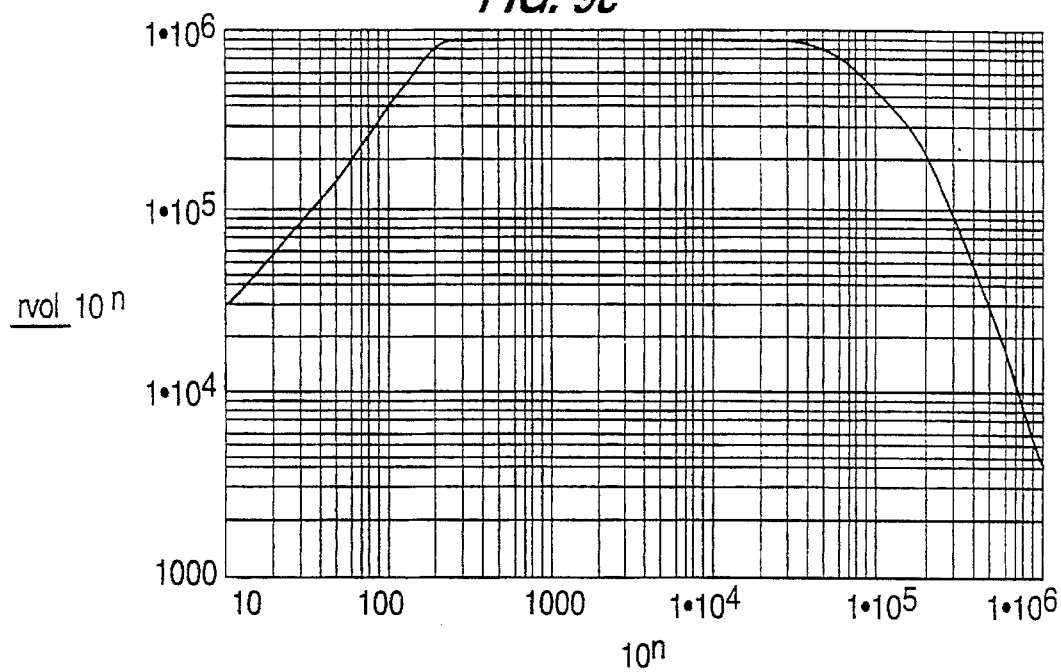
Figure 9D:
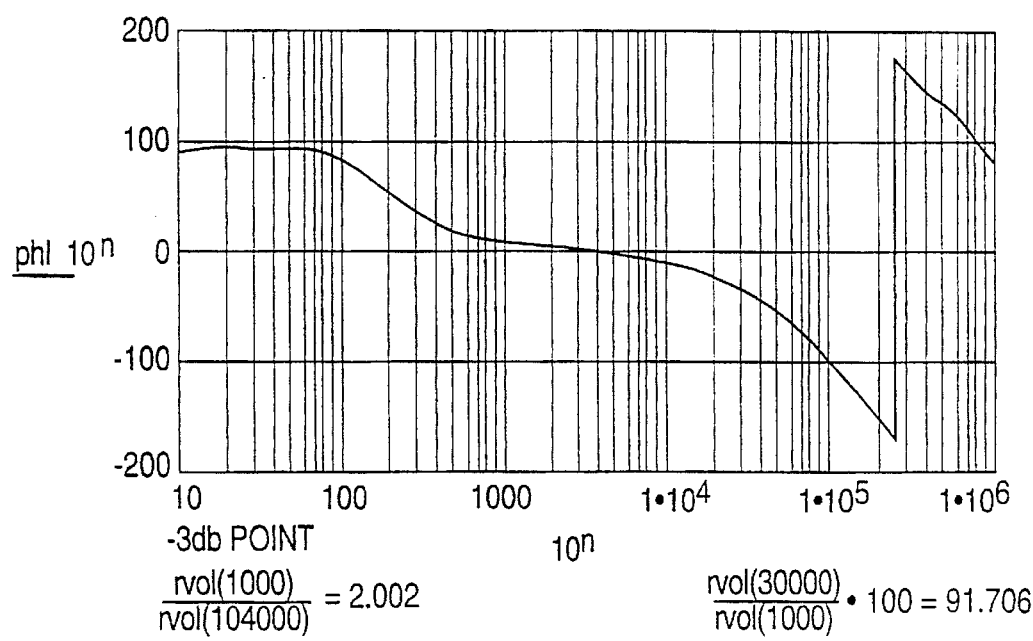
Figure 9E:
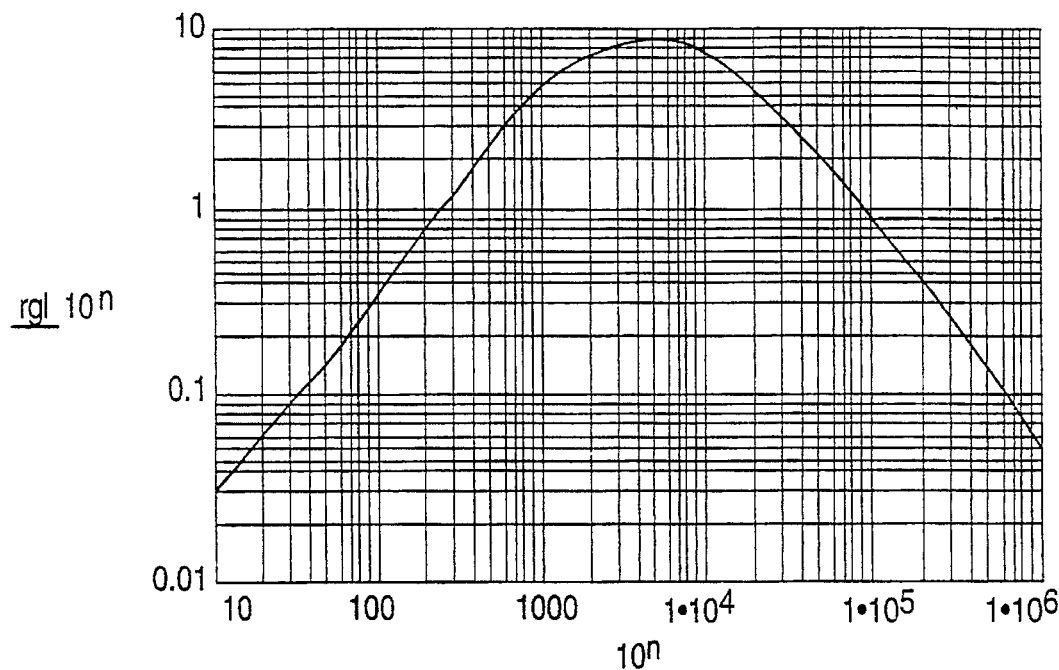
Figure 9F:
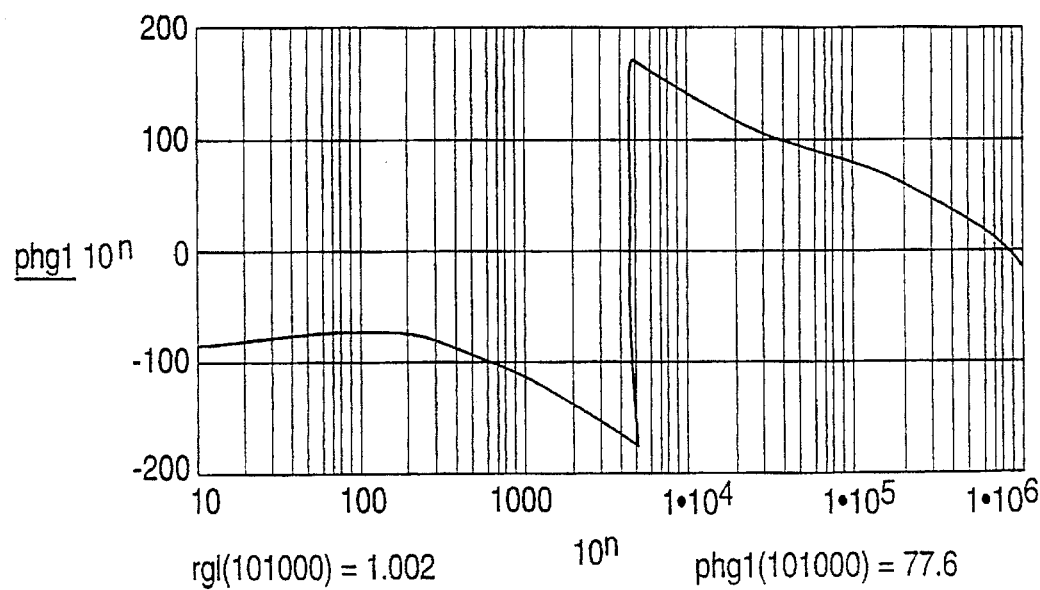

FIG. 9b is a specific example of the bandpass configuration described in FIG. 9a. In this example, Z1 if formed with resistor 922 in series with a capacitor 924. Z2 is a resistor 926 in parallel with capacitor 928. Z3 is a resistor 930 in parallel with capacitor 932, while Z4 is formed with resistor 934 in series with capacitor 936. Z5 is a resistor 938 in parallel with capacitor 940. This configuration yields the closed loop response depicted in FIGS. 9c and 9d and the open loop response depicted in FIGS. 9e and 9f for the following values of the components: resistor 922=2k$\Omega$, capacitor 924=0.01 μf, resistor 926=47K$\Omega$, capacitor 928 10 pf, resistor 930=47K$\Omega$, capacitor 923=10 pf, resistor 934= 47K$\Omega$, capacitor 936=0.022 μf, resistor 938=1M$\Omega$ and capacitor 940=2.2 pf.

A method for forming a wideband, low noise amplifier using commercially available components is disclosed. Further, as shown in the examples herein, the frequency response of the amplifier according to the invention can be tailored to provide, for example, a band pass amplifier exhibiting the desired performance attributes.

Figure 10:
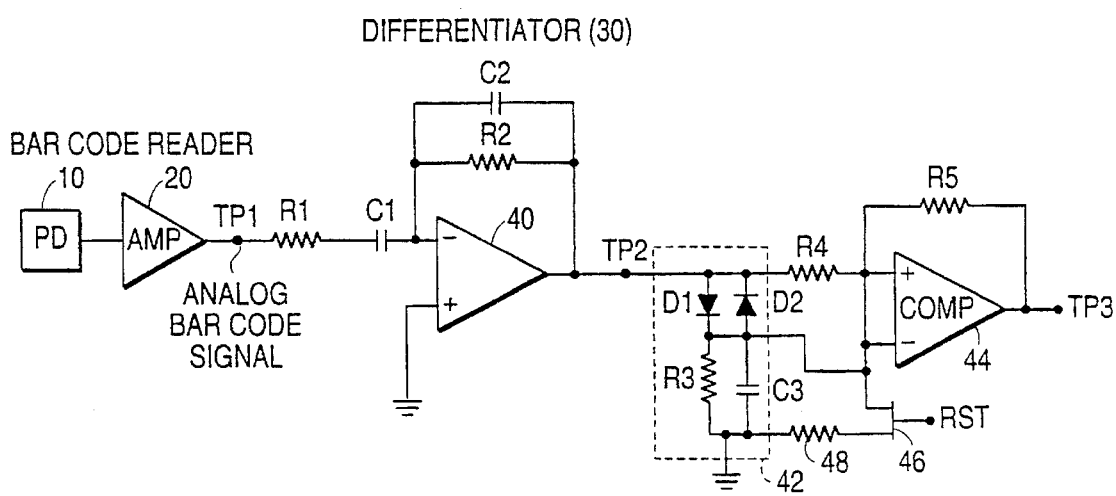
FIG. 10 is a schematic diagram of a bar-code scanner which can benefit from incorporation of the amplifier according to the invention.

As previously noted, one application of the amplifier according to the invention is in a bar code scanning apparatus. FIG. 10, Which is taken from U.S. Pat. No. 5,210,397 to Eastman, incorporated herein by reference, shows photodiode 10 providing signals to amplifier 20, which provides the analog bar code signal to the remaining circuitry in the scanner. A bar code scanner can be implemented with the amplifier according to the invention herein used as amplifier 20 in FIG. 10. Thus, a bar code scanner can be formed using the amplifier according to the invention herein to enhance performance of the bar code scanner. Illumination from the code is photodetected to produce an analog signal having changes in relative polarity from a relatively high to a relatively low polarity as the illumination changes due to the black bars and the white spacing therebetween in the bar code. Such analog signals are then translated into a corresponding train of pulses which contain information as to the symbol represented by the code, usually numbers or letters depending on the code protocol. One known protocol is the universal product code or UPC used on grocery and other products. The analog electronics of the bar code reader, as shown in FIG. 10, have a photodetector which receives the illumination from the bars of the code. The bars have leading edges and lagging edges. As the photodetector is effectively scanned across the code, an electrical signal results which is amplified in an amplifier 20. The amplifier 20 can be an amplifier as disclosed herein. The output of the amplifier changes from a relatively positive amplitude to a relatively negative amplitude relative to a baseline. Differentiator 30 provides a signal having peaks of relative opposite amplitude coincident with crossovers of the baseline and with the edges of the bars. The output of the differentiator is applied to an integrating or delay circuit 42 having a time constant longer than the time constant of the differentiator 30. An output pulse train is generated by a comparator 44.

An amplifier according to the invention is also useful in wideband video amplifiers where run capacitance also works to limit bandwidth. As previously noted, an amplifier according to the invention generally does not need a bandwidth limiting capacitor across the feedback resistor, as required by the prior art circuit shown in FIG. 1. An amplifier according to the invention is well-suited for amplifying signals whose source impedance is high.

The amplifier according to the invention provides a reasonable and cost effective approach to enhance bandwidth performance without requiring expensive components or dual power supplies. For example, as illustrated herein, a commercially available TLC272 amplifier can be used which requires only a single power supply between 3.3 and 12 volts. Such an amplifier is also available in a surface mount configuration and has low input bias and offset currents. The amplifier circuit according to the invention provides wide bandwidth and low noise performance using such low cost components and avoids the need for higher cost operational amplifier components requiring dual power supplies.

From the foregoing description, it will be apparent to those skilled in the art that these beneficial attributes of this circuit can be applied to many applications. Variations and modifications in the herein described application, within the scope of the invention, will undoubtedly suggest themselves to those skilled in the art. Accordingly, the foregoing description should be taken as illustrative and not in a limiting sense.

What is claimed is:

1. A method of amplifying a signal, the method comprising applying said signal to a cascade of at least two closed loop amplifier circuits, each of said at least two closed loop amplifier circuits having a dominant pole in a first frequency range, said cascade having negative feedback from a last stage of said cascade to a first stage of said cascade, said cascade having a dominant pole at a second frequency in a range higher than said first frequency range, wherein said signal is amplified across a wide range of frequencies.

2. The method recited in claim 1 wherein components are selected to select said dominant pole of said cascade.

3. An amplifier circuit comprising:

a cascade of at least two closed loop amplifier circuits, each of said at least two closed loop amplifier circuits having a dominant pole in a first frequency range, said cascade having negative feedback from a last stage of said cascade to a first stage of said cascade, thereby forming a dominant pole of said cascade at a second frequency in a range higher than said first frequency range, wherein an input signal to the amplifier circuit is amplified across a wide range of frequencies.

4. An amplifier circuit comprising:

a first stage providing a high impedance input for the amplifier circuit, said first stage being configured as a low gain stage and having an output, said first stage having a dominant pole in a first frequency range; and a second stage providing an output for the amplifier circuit, said second stage configured to receive the output of the first stage, said second stage having a dominant pole in the first frequency range, said amplifier circuit having negative feedback from the second stage to the first stage, wherein the first stage is configured to reduce a phase shift between an input signal to the amplifier circuit and the negative feedback, and wherein the second stage is configured to shift a dominant pole of the amplifier circuit to a frequency in a range higher than the first frequency range.

5. The amplifier circuit according to claim 4, wherein the negative feedback is non-capacitive.

6. The amplifier circuit according to claim 4, wherein the negative feedback is provided to a non-inverting input of the first stage.

7. The amplifier circuit according to claim 4, wherein the amplifier circuit is configured to provide directly proportional amplification of the input signal to the amplifier across a wide frequency range.

* * * * *